United States Patent
Pollard, II et al.

(10) Patent No.: US 6,705,144 B2
(45) Date of Patent: Mar. 16, 2004

(54) MANUFACTURING PROCESS FOR A RADIAL FIN HEAT SINK

(75) Inventors: Lloyd L. Pollard, II, Portland, OR (US); Murli Tirumala, Beaverton, OR (US); Jim Noval, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 57 days.

(21) Appl. No.: 09/950,898

(22) Filed: Sep. 10, 2001

(65) Prior Publication Data

US 2003/0046967 A1 Mar. 13, 2003

(51) Int. Cl.⁷ .................... B21B 15/00; B21C 23/18
(52) U.S. Cl. .............. 72/68; 72/112; 72/256; 72/263; 72/267
(58) Field of Search ................. 72/67, 68, 112, 72/115, 256, 257, 263, 267; 29/290.03; 165/80.3; 361/69.7

(56) References Cited

U.S. PATENT DOCUMENTS

| | | | |
|---|---|---|---|
| 3,182,114 A | 5/1965 | Burgess et al. ............. 174/15 |
| 3,187,082 A | 6/1965 | Allison ..................... 174/35 |
| 3,239,003 A | 3/1966 | Boudette et al. ........... 165/185 |
| 3,466,909 A | * 9/1969 | Weber ......................... 72/68 |
| 3,779,291 A | * 12/1973 | Yeo .......................... 140/147 |
| 4,520,541 A | * 6/1985 | Miki et al. ............... 29/890.03 |
| 4,557,225 A | 12/1985 | Sagues et al. ............ 123/41.31 |
| 4,688,077 A | 8/1987 | Wakabayashi et al. ........ 357/81 |
| 4,733,293 A | 3/1988 | Gabuzda ..................... 357/81 |
| 5,132,875 A | 7/1992 | Plesinger .................. 361/386 |
| 5,375,652 A | 12/1994 | Matsunaga et al. ........ 165/80.3 |
| 5,437,327 A | 8/1995 | Chiou ....................... 165/122 |
| 5,567,983 A | 10/1996 | Hirano et al. .............. 257/722 |
| 5,597,034 A | 1/1997 | Barker, III et al. ........ 165/80.3 |
| 5,661,638 A | 8/1997 | Mira ........................ 361/697 |
| 5,704,416 A | 1/1998 | Larson et al. ........... 165/104.33 |
| 5,761,044 A | 6/1998 | Nakajima .................. 361/719 |
| 5,777,844 A | 7/1998 | Kiefer ...................... 361/704 |
| 5,785,116 A | 7/1998 | Wagner .................... 165/80.3 |
| 5,794,685 A | 8/1998 | Dean ........................ 165/121 |
| 5,920,458 A | 7/1999 | Azar ........................ 361/704 |
| 5,975,194 A | 11/1999 | Wagner .................... 165/80.3 |
| 6,069,794 A | 5/2000 | Chuang ..................... 361/697 |
| 6,075,702 A | 6/2000 | Gardner et al. ............ 361/704 |
| 6,152,214 A | 11/2000 | Wagner ..................... 165/121 |
| 6,176,299 B1 | 1/2001 | Hanzlik et al. ............ 165/80.3 |
| 6,189,601 B1 | 2/2001 | Goodman et al. .......... 165/80.3 |
| 6,196,300 B1 | 3/2001 | Checchetti ................ 165/80.3 |
| 6,208,511 B1 | 3/2001 | Bortolini et al. ........... 361/698 |
| 6,219,239 B1 | 4/2001 | Mellberg et al. ............ 361/704 |
| 6,360,816 B1 | 3/2002 | Wagner .................... 361/697 |
| 6,374,490 B1 | * 4/2002 | Miyahara .................. 29/890.03 |
| 6,411,510 B2 | 6/2002 | Sasa et al. ................ 361/697 |
| 6,419,007 B1 | 7/2002 | Ogawara et al. ........... 165/80.3 |
| 2002/0017378 A1 | 2/2002 | Hu ......................... 165/80.3 |
| 2002/0018336 A1 | 2/2002 | Liang ...................... 361/697 |

FOREIGN PATENT DOCUMENTS

| | | | |
|---|---|---|---|
| EP | 0856888 | 8/1998 | |
| EP | 0860874 | 8/1998 | |
| EP | 1081760 | 3/2001 | ......... H01L/23/467 |
| JP | 6-77677 | 3/1994 | ......... H05K/7/20 |

* cited by examiner

*Primary Examiner*—Ed Tolan
(74) *Attorney, Agent, or Firm*—Schwegman, Lundberg, Woessner & Kluth, P.A.

(57) ABSTRACT

A heat dissipation system and method for extracting heat from an integrated circuit device includes a thermally conductive base having substantially planar upper and lower surfaces, the upper surface is disposed across from the lower surface, and the lower surface is adapted to contact an integrated circuit device. A conductive heat exchange portion including an array of fins extends angularly away from the upper surface of the base. The array has a chamber within to house an air movement device so that the air introduced by the air movement device creates a swirling air movement over the heat exchange portion to increase air movement around the heat exchange portion to enhance the heat extraction from the heat exchange portion.

16 Claims, 4 Drawing Sheets

MANUFACTURING PROCESS FOR A RADIAL FIN HEAT SINK

CROSS REFERENCES

This application is related to the following U.S. patent applications which are assigned to the same Assignee as the present application:

U.S. patent application Ser. No. 09/716,510, filed Nov. 20, 2000, entitled "A High-Performance Fin Configuration For Air-Cooled Heat Dissipation Device;"

U.S. patent application Ser. No. 09/716,877, filed Nov. 20, 2000, entitled "A High Performance Fin Configuration for Air-Cooled Heat Sinks;"

U.S. patent application Ser. No. 09/766,757, filed Jan. 22, 2001, entitled "High-Performance Heat Sink Configurations For Use In High Density Packaging Applications;"

U.S. patent application Ser. No. 09/800,120, filed Mar. 5, 2001, entitled "Radial Folded Fin Heat Sink."

U.S. patent application Ser. No. 09/860,978, now U.S. Pat. No. 6,479,895 filed May 18, 2001, entitled "High Performance Air Cooled Heat Sinks Used in High Performance Packaging Applications;"

U.S. patent application Ser. No. 09/950,101, filed concurrently with this application, entitled "Radial Folded Fin Heat Sinks and Methods of Making and Using Same";

U.S. patent application Ser. No. 09/950,100, filed concurrently with this application, entitled "Electronic Assemblies With High Capacity Heat Sinks and Methods of Manufacture;" and U.S. patent application Ser. No. 10/047,101, entitled "Heat Sinks and Method of Formation."

TECHNICAL FIELD

This invention relates generally to a heat dissipation technique for an integrated circuit assembly, and more particularly to a technique for dissipating heat from an integrated circuit device.

BACKGROUND

Integrated circuit devices, microprocessors and other related computer components are becoming more and more powerful with increasing capabilities, resulting in increasing amounts of heat generated from these components. Packaged units and integrated circuit device sizes of these components are decreasing or remaining the same, but the amount of heat energy given off by these components per unit volume, mass, surface area or any other such metric is increasing. In current packaging techniques, heat sinks typically consist of a flat base plate, which is mounted to the integrated circuit device on one side. The heat sinks further include an array of fins running perpendicular to the flat base plate on the other side. Generally, the integrated circuit devices (which are the heat sources) have a significantly smaller footprint size than the flat base plate of the heat sink. The flat base plate of the heat sink has a large footprint, that requires more motherboard real estate than the integrated circuit device in contact therewith. The larger size of the base plate causes the outermost part of the base plate that is not directly in contact with the integrated circuit device to have a significantly lower temperature than the part of the base plate that is directly in contact with the integrated circuit device. Furthermore, as computer-related equipment becomes more powerful, more components are being placed inside the equipment and on the motherboard which further requires more motherboard real estate. In addition, the base plate of prior art heat sink designs is at the same level as the integrated circuit device to which it is attached. Consequently, the flat base plate configuration of the heat sink generally ends up consuming more motherboard real estate than the integrated circuit device on which it is mounted. Also, current design practice dictates that the fins extend to the edge of the flat base plate, and in order to grow the fins laterally the flat base plate also has to grow. As a result, the larger footprint size of the base plate prevents other motherboard components, such as low-cost capacitors, from being positioned around or on the microprocessor. Thus, the large amounts of heat produced by many such integrated circuits and the increasing demand for motherboard real estate need to be taken into consideration when designing the integrated circuit mounting and packaging devices. Also, the current manufacturing processes require cutting a large block of metal, and further machining one individual angular gap between fins at a time to produce a heat sink. This is generally a difficult, time consuming, and expensive process. Further the machining process results in wasting a lot of material.

For the reasons stated above, and for other reasons stated below which will become apparent to those skilled in the art upon reading and understanding the present specification, there is a need in the art for a low-mass enhanced heat dissipation device and method that has minimal lateral heat spreading resistance, and a high performance fin area above adjacent components. Also, there is a need for a heat dissipation device that does not consume more motherboard real estate than the integrated circuit device to which it is attached, to accommodate low-cost electronic components needing to be positioned around the microprocessor. Further, there is also a need for an easier, less time consuming, and cost-effective manufacturing process that does not result in wasting a lot of material in producing the heat dissipation device.

DETAILED DESCRIPTION

Figure 1:
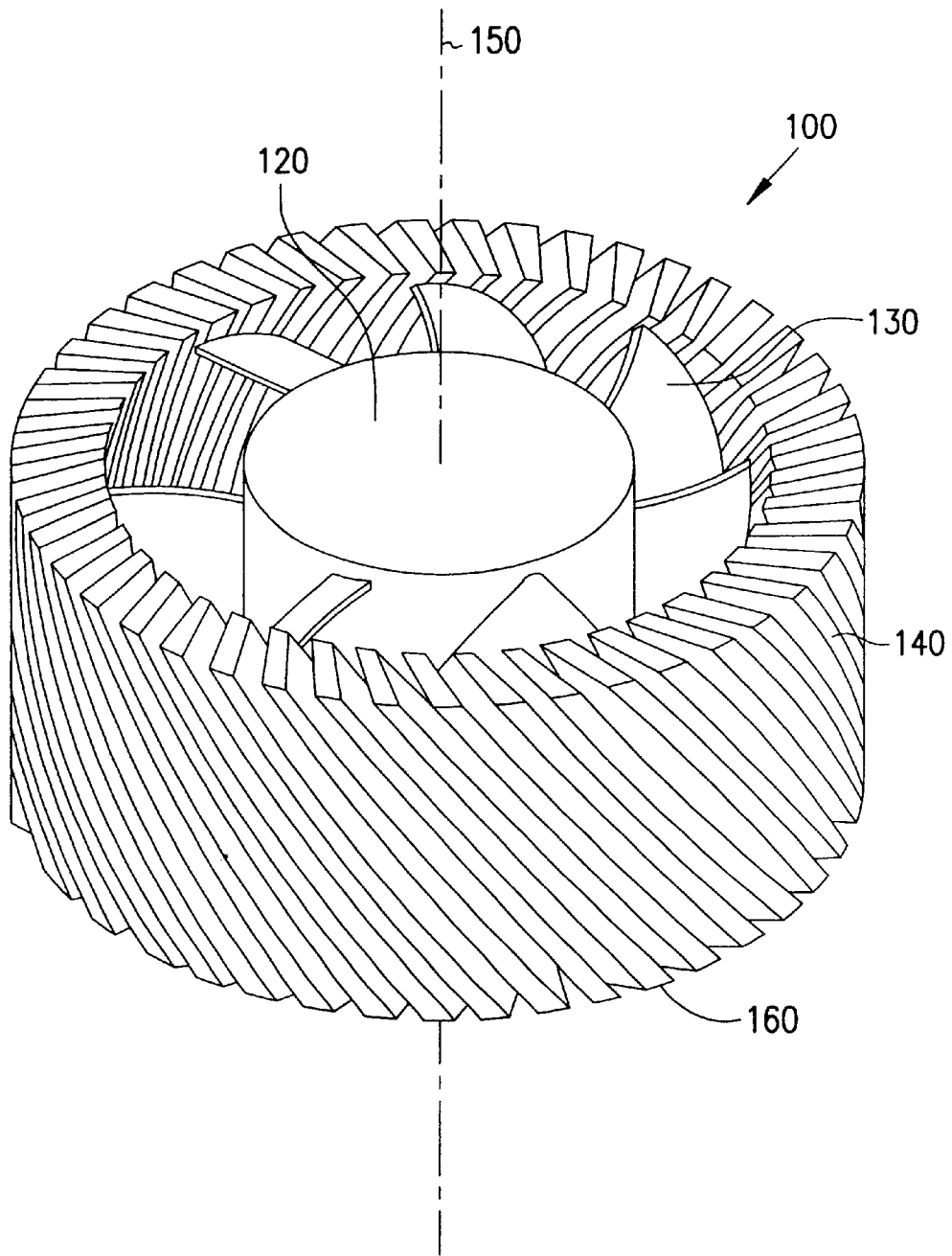
FIG. 1 is an isometric view of a prior art heat sink.

In the following detailed description of the embodiments, reference is made to the accompanying drawings that illustrate the present invention and its practice. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included in other embodiments. The following detailed description is, therefore, not to be taken in a limiting sense, and the scope of the present invention is defined only by the appended claims, along with the full scope of equivalents to which such claims are entitled.

This document describes, among other things, an enhanced heat dissipation device including a chamber within to receive and house an air movement device that allows electronic components to be positioned around the microprocessor while maintaining high performance and cost effectiveness by leveraging currently enabled high-volume manufacturing techniques.

FIG. 1 shows an isometric view of a prior art heat sink 100 which includes a fan assembly 120 within the heat sink 100. As shown in FIG. 1, the fan assembly 120 includes multiple fan blades 130. Also shown is a central axis 150 of the heat sink. An array of fins 140 extend upward from a base 160 such that the array of fins are angular with respect to the central axis 150. The prior art heat sink 100 shown in FIG. 1 is made from machining a large block of metal by first boring the center of the block and then individually cutting each gap between fins at an angle relative to the central axis 150 to produce the array of fins 140. This is generally a very difficult, slow and expensive method of producing the heat sinks shown in FIG. 1. Further, all of the material removed during the cutting process to produce the heat sink 100 ends up as a wasted material.

Figure 2:
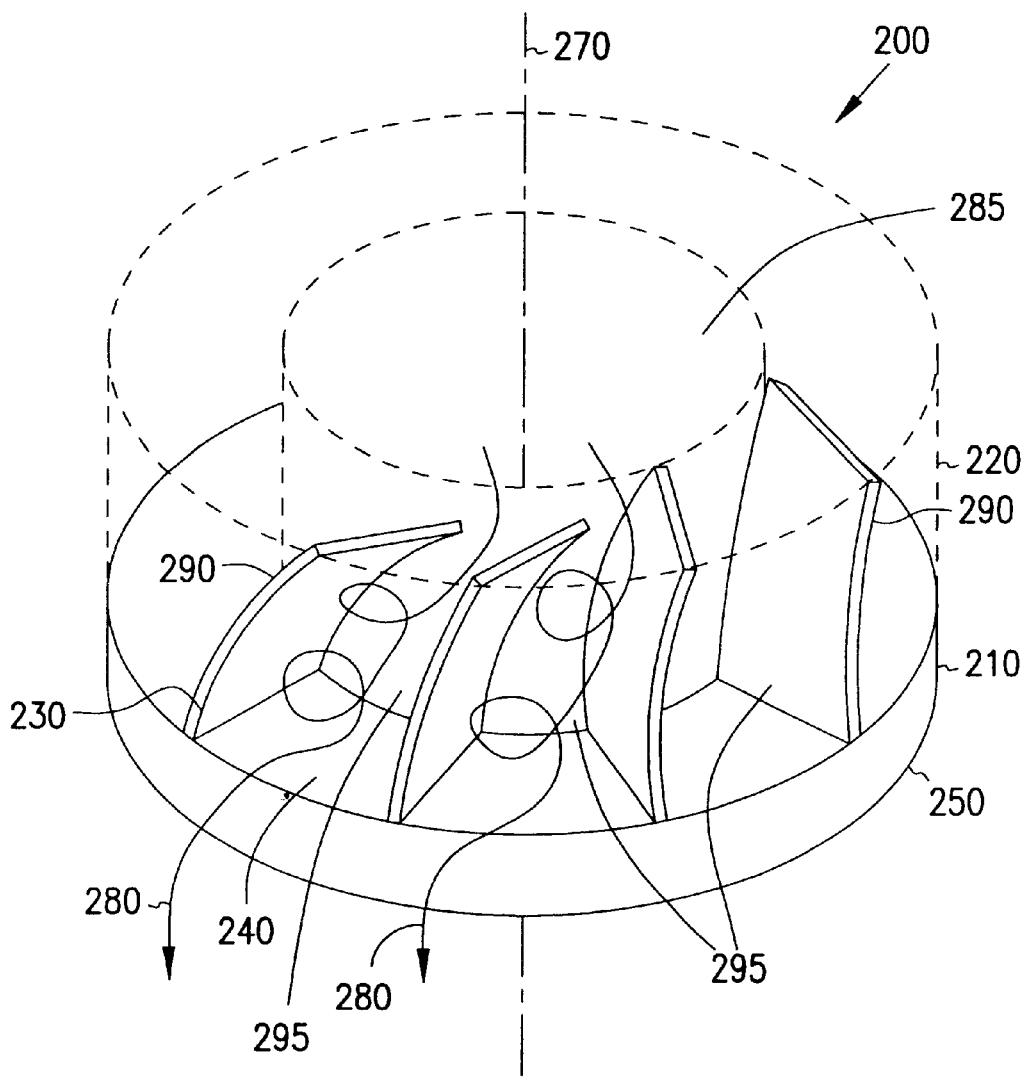
FIG. 2 is an isometric view of an embodiment of a heat dissipation device according to the present invention.

FIG. 2 is an isometric view of the heat dissipation device 200 produced according to the teachings of the present invention. The heat dissipation device 200 shown in FIG. 2 includes a thermally conductive base 210, and a conductive heat exchange portion 220. The heat exchange portion 220 shown in FIG. 2 extends angularly away from the further surface 240. In some embodiments, the conductive heat exchange portion 220 includes an array of fins 230. The thermally conductive base 210 has substantially planar surfaces 250. The further surface 240 is disposed across from the planar surface 250. The planar surface 250 is adapted to contact an electronic device such as an integrated circuit device. The base 210 including the heat exchange portion 220 has a central axis 270. The farther and planar surfaces 240 and 250 can be substantially perpendicular to the axis 270. The heat exchange portion 220 has a chamber 285 within to house an air movement device such as a fan including at least one fan blade. The chamber 285 is constructed and arranged to create a swirling air movement over the heat exchange portion 220 to increase the heat transfer coefficient around the heat dissipation device 200 to enhance heat dissipation from the heat dissipation device 200. It can also be envisioned that the air movement device can be mounted on the heat dissipation device 200 instead of mounting the air movement device in the chamber 285 to facilitate other physical and air movement patterns 280 around the heat dissipation device 200.

The fins 230 shown in FIG. 2 extend angularly away from the base 210. In some embodiments, the fins are inclined 290 with respect to the central axis 270 such that the air introduced over the fins causes the air to swirl, turn around, and move away 280 from the fins to increase air utilization around the heat dissipation device 200 and further enhance heat dissipation from the heat dissipation device 200.

The heat dissipation device 200 can have outer shapes that are circular, square, rectangular, elliptical, and/or other shapes suitable for heat dissipation. The heat dissipation device 200 is made from materials such as copper, aluminum, and/or other such materials suitable for dissipating heat away from the electronic device. The electronic device can be a microprocessor, a digital signal processor, and/or an application-specific integrated circuit device.

Figure 3:
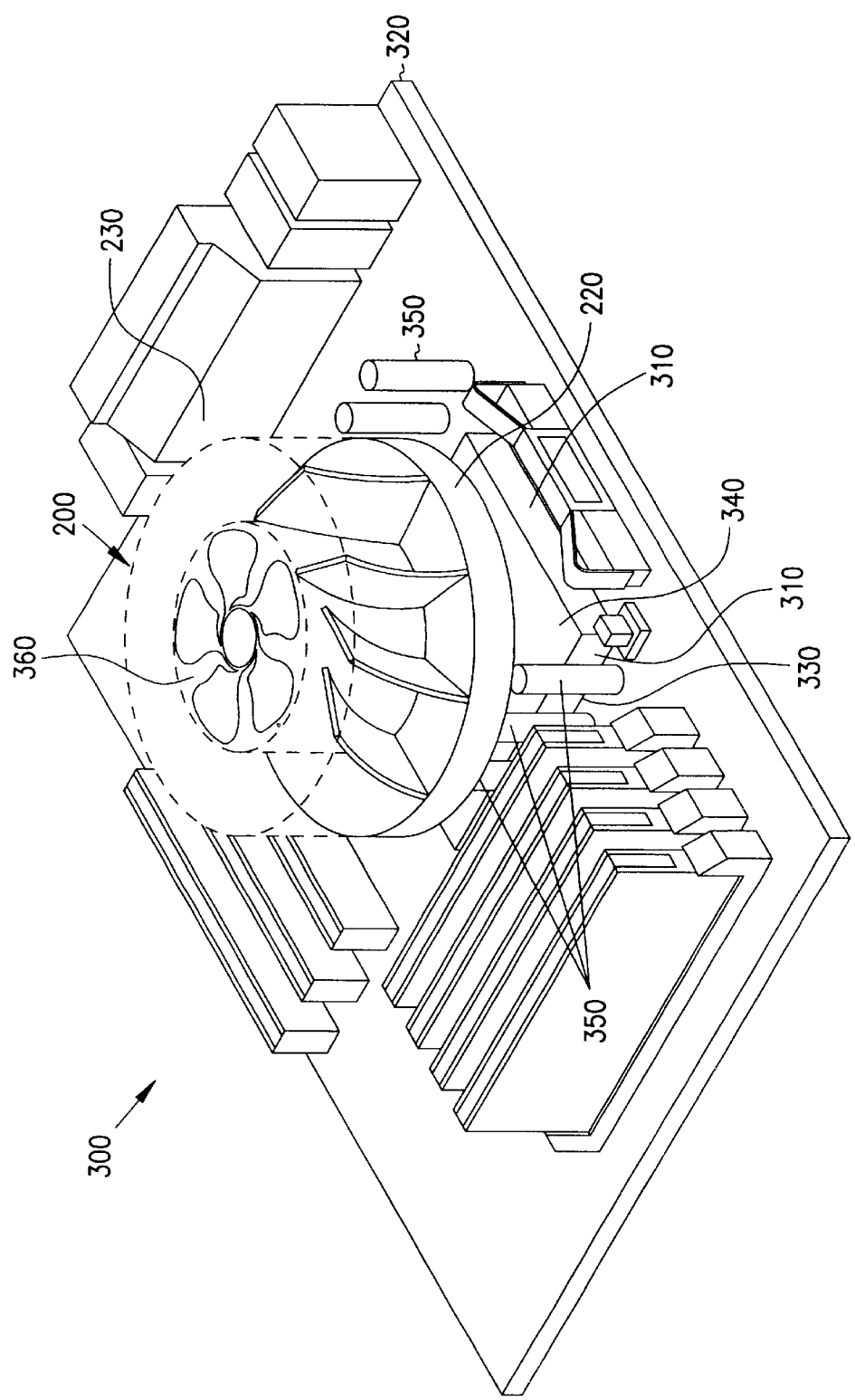
FIG. 3 is an isometric view of the heat dissipation device shown in FIG. 2 attached to a microprocessor mounted onto an assembled printed circuit board.

FIG. 3 is an isometric view of an electronic system 300 showing the enhanced heat dissipation device 200 shown in FIG. 2, attached to a microprocessor 310 on an assembled motherboard 320. In the example embodiment shown in FIG. 3, the microprocessor 310 has front and back sides 330 and 340. The front side 330 is disposed opposite the back side 340 of the microprocessor 310. As shown in FIG. 3, the front side 330 is attached to the motherboard 320 including components such as capacitors 350 and other such electrical components. The planar surface 250 shown in FIG. 2, of the enhanced heat dissipation device 200, is attached to the back side 340 of the microprocessor 310.

It can also be envisioned that the size of the planar surface 250 of the base 210 to be the same as the back side 340 of the microprocessor to maximize the heat dissipation characteristics of the heat dissipation device 200. The heat transfer rate between the base 210 and the back side 340 of the microprocessor can be further increased by thermally coupling the base 210 to the back side 340 using a layer of thermal grease, and/or a layer of thermally conductive adhesive material. Also, shown in FIG. 3 is an air movement device such as a fan 360 disposed within the chamber 285 to increase the heat dissipation rate from the heat dissipation device 200 by forcing a flow of air through the inclined slots 295 and over the inclined fins 230.

FIGS. 4, 5, 6, and 7 illustrate an example embodiment of forming the heat dissipation device 200 shown in FIG. 2 using an impact extrusion process, also referred to as micro-forging operation. FIGS. 4, 5, 6, and 7 illustrate the forming of the heat dissipation device 200 shown in FIG. 2 by using impact extrusion process which requires striking a cold metal slug of heat conductive deformable material 400 between two confronting top and bottom dies 410 and 420 having cavities corresponding to the spacings, alignments, height, and width of the fins 230 of the heat dissipation device 200 shown in FIG. 2.

Figure 4:
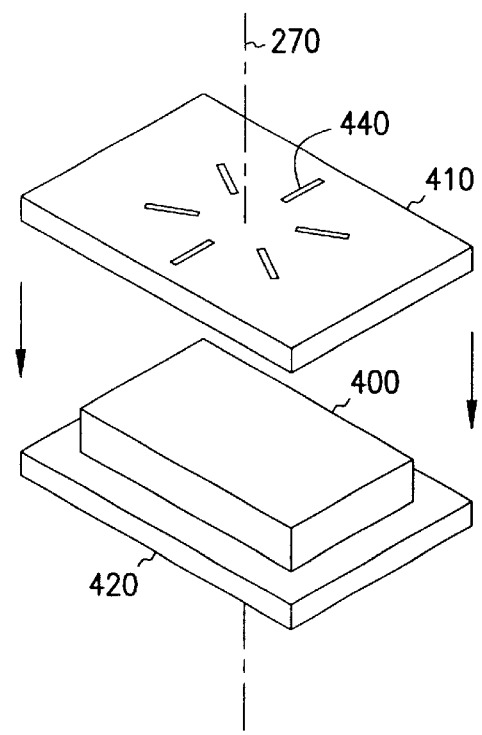
FIGS. 4, 5, 6, and 7 illustrate one example embodiment of forming the heat dissipation device shown in FIG. 2 using an impact extrusion process.

Impact extrusion is a forming process that produces finished work pieces by striking the slug of deformable material 400 contained between the two impinging pair of dies 410 and 420. During the impact extrusion process, the slug 400 is forced to flow into the cavities 440 in the die 410 by a single high speed blow, to form the fins 430 as shown in FIG. 4. Impact extrusion is generally a cold forging technique. The impact extrusion process permits the mass production of parts with a precision and ultra-fine detail generally not attainable with the conventional extrusion and forging processes. Impact extrusion generally produces a finished part that does not require any subsequent machining operations. The finish produced by impact extrusion generally has a high resistance to corrosion. Also, impact extrusion produces a homogeneous and undistorted grain and micro-structure in the finished part.

Figure 5:
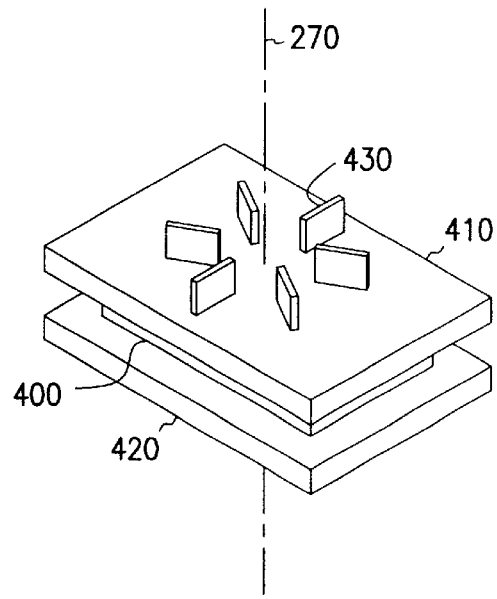

FIG. 5 shows the formed fins 430 extending beyond the top die 410 after the striking of the cold slug 400 between the two confronting dies 410 and 420 to form the fins 430. As shown in FIG. 5, the top and bottom dies 410 and 420 are in place after completing the striking of the cold slug 400.

Figure 6:
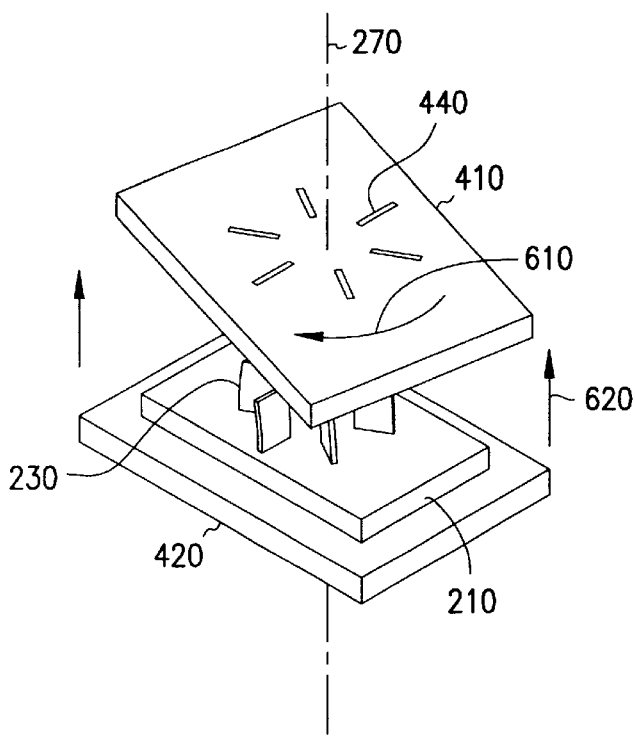

FIG. 6 shows the formation of the incline 290 in the fins 430 during gradual rotation 610 of the fins 430 by the top die 410 about the central axis 270 in the desired direction and angle as the top die 410 is translated along the central axis 270 and away from the formed angled fins 230 to produce a less time consuming and cost effective heat dissipation device 200 that does not waste any material. In some embodiments, the fins 430 are bent by rotating the a die member about the central axis 270 and while translating the die member away from the base 210 along the central axis 270.

Figure 7:
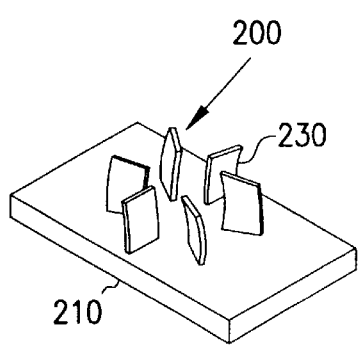

In some embodiments, the die member is rotated 610 about the central axis 270 while translating the member away 620 from the base 210 along the central axis 270 is performed with the rate of rotation and the rate of translation held in a predetermined relationship to each other to establish a predetermined angle profile for the fins. In some embodiments, the die member is rotated about the central axis 270 while translating the member away from the base 210 along the central axis 270 is performed with the rate of rotation and the rate of translation held generally constant to provide uniform inclination of the fins 430. It can be envisioned that by controlling the rotational speed 610 and the speed of translation of the top die 410, the amount of inclination in the fins 230 can be controlled to obtain a desired heat dissipation from the device 200. FIG. 7 shows the formed heat dissipation device 200 shown in FIG. 2 after completing the operations described with reference to FIGS. 4, 5, and 6.

In some embodiments, the heat dissipation device 200 shown in FIG. 2 is produced by microforging a base 210 from a billet 400 of heat conductive material by working the material under extreme pressure. The produced base 210 includes a substantially planar surface 250 adapted to contact an electronic device. The base 210 has a central axis 270 projecting and substantially perpendicular to a further surface 240 of the device. In some embodiments, the heat dissipation device 200 shown in FIG. 2 is produced by microforging the base 210 from a billet 400 by working the billet under extreme pressure. The produced base 210 has a central axis 270 aligned with an axis along which pressure was applied to the billet. In some embodiments, includes softening the billet under extreme pressure to produce the device 200.

Further, the microforging forms an array of fins 230 projecting from the further surface 240 of the device 200 using a die member 410 having an extrusion force applied to it along the central axis 270 such that the formed fins 230 project upwardly from the base 210 having a chamber 285 disposed about the central axis 270 by extrusion of the billet material 400 through cavities 440 in the die member 410. In some embodiments, the microforging extrudes a portion of the base 210, while the base 210 is in the softened state, through the cavities 440 in the die member by rapidly applying an extrusion force along the central axis 270 to form an array of fins 230 from the base 210.

Further, the fins 230 are angled 290 about the central axis 270 by rotating 610 the die member 410 about the central axis 270 as the die member 410 is translated 620 along the axis while the billet material 400 remains in a softened state as the fins 230 are removed from the cavities 440. In some embodiments, the fins 230 are angled out of alignment with the central axis 270 by rotating the die member relative to the base about the central axis 270 as the die member is simultaneously translated away 620 from the base 210 along the central axis 270 as the fins 230 are removed from the cavities 440. In some embodiments, the cavities 440 are apertures in the die member.

In these embodiments, the chamber 285 is further microforged to house an air movement device such as a fan for forcing a flow of air 280 through the inclined slots 295 and the fins 230. In some embodiments, the device 200 is microforged using a billet made from heat conductive materials such as copper, aluminum, and/or other such materials suitable for dissipating heat away from the electronic device.

In some embodiments, the heat dissipation device is produced by impact extruding a slug of heat conductive deformable material 400 by rapidly compressing the slug between pair of dies 410 and 420 to form a device body having an array of fins 230 projecting upwardly from a base portion surrounding the central axis 270. In some embodiments, the slug is extruded to include a chamber within the fins and to form an air flow path chamber defined by a plurality of slots 295 between the fins 230. In some embodiments, the heat dissipation device is produced by impact extruding a slug of heat conductive material 400 by rapidly compressing the slug between the pair of dies 410 and 420 to form a device body having an array of fins projecting from the base portion surrounding the central axis 270 defining a chamber wall having a plurality of slots between the fins to define an air flow path through the wall.

Further, the die 410 is rotated 610 about the central axis 270 and with respect to the other die 420 during retraction 620 of the dies 410 and 420 from the fins 230 to bend the formed fins and incline the slots 290 about the base 210 and the central axis 270 to form an angular air flow path chamber 280 defined by the plurality of inclined slots 295 between the inclined fins 230. In some embodiments, one of the dies is rotated 410 with respect to the other die 420 about the central axis 270 while retracting 620 the dies 410 and 420 from the fins 230 to bend the fins 230 and cause the slots 295 to incline about the central axis 270 to form an angular flow path from the chamber 285 defined by the incline slots 295 between the fins 230. In this embodiment, the chamber 285 is further extruded to house an ir movement device such as a fan to force a flow of air through the inclined slots 295 and over the fins 230. Also in these embodiments, the device 200 is impact extruded using a slug of deformable material made from materials such as copper, aluminum, and/or other such materials suitable for dissipating the heat away from the electronic device.

Conclusion

The above-described method and device provides, among other things, an enhanced heat dissipation device having fins including a chamber within that extends angularly upward from a thermally conductive base providing high performance and cost effectiveness by leveraging currently enabled high-volume manufacturing techniques.

What is claimed is:

1. A method of forming a heat dissipation device from a slug of pressure deformable material, comprising:

forming the slug into a shape conforming to the die member, the die member having a plurality of fin forming cavities therein disposed about a central axis such that the forming of the slug forces the material to flow into the cavities to form an array of fins projecting upwardly from a base; and rotating the die member about the central axis while translating the die member away from the base along the central axis and away from the base to bend the fins.

2. The method of claim 1, wherein forming the slug is performed by rapidly applying pressure to the slug with the die member.

3. The method of claim 1, wherein rotating the die member about the central axis while translating the member away from the base along the central axis is performed with the rate of rotation and the rate of translation held in a predetermined relationship to each other to establish a predetermined angle profile for the fins.

4. The method of claim 3, wherein establishing the predetermined angle profile for the fins comprises establishing the angle profile for the fins such that an air introduced over the angled fins causes the air to swirl, turn around, and move away from the fins to increase air utilization and enhance hear dissipation around the heat dissipation device.

5. The method of claim 3, wherein rotating the die member about the central axis while translating the member away from the base along the central axis is performed with the rate of rotation and the rate of translation held generally constant to provide uniform inclination of the fins.

6. The method of claim 1, wherein forming the base comprises forming a substantially planar surface adapted to contact an electronic device.

7. A method of forming a heat dissipation device using an impact extrusion process, comprising:

provide a slug of heat conductive deformable material;

rapidly compressing the slug between a pair of dies to form a device body having an array of fins projecting from a base portion surrounding a central axis and defining a chamber wall having a plurality of slots between the fins to define an air flow path through the wall; and rotating one of the dies with respect to the other die about the central axis while retracting the dies from the fins to bend the fins and cause the slots to incline about the central axis, and to form an angular flow path from the chamber defined by the inclined slots between the fins.

8. The method of claim 7, wherein rotating one of the dies with respect to the other die about the central axis while retracting the dies away from the base is performed with the rate of rotation and the rate of translation held in a predetermined relationship to each other to establish a predetermined angle profile for the fins.

9. The method of claim 8, wherein establishing the predetermined angle profile for the fins comprises establishing the angle profile for the fins such that an air introduced over the angled fins causes the air to swirl, turn around, and move away from the fins to increase air utilization and enhance hear dissipation around the heat dissipation device.

10. The method of claim 8, wherein rotating one of the dies with respect to the other die about the central axis while retracting the member away from the base along the central axis is performed with the rate of rotation and the rate of translation held generally constant to provide uniform inclination of the fins.

11. The method of claim 7, wherein forming the base comprises forming a substantially planar surface adapted to contact an electronic device.

12. A method of forming a heat sink using a microforging process, comprising:

working a billet of heat conductive material under extreme pressure applied by a die member to form a base having a central axis aligned with an axis along which pressure was applied to;

extruding a portion of the base, while in the softened state, through cavities in the die member by rapidly applying an extrusion force along the central axis to form an array of fins from the base; and rotating the die member relative to the base about the central axis as the die member is simultaneously translated away from the base along the central axis as the fins are removed from the cavities to angle the fins out of alignment with the central axis while material remains in the softened state.

13. The method of claim 12, wherein rotating die member about the central axis while translating the member away from the base along the central axis is performed with the rate of rotation and the rate of translation held in a predetermined relationship to each other to establish a predetermined angle profile for the fins.

14. The method of claim 13, wherein establishing the predetermined angle profile for the fins comprises establishing the angle profile for the fins such that an air introduced over the angled fins causes the air to swirl, turn around, and move away from the fins to increase air utilization and enhance hear dissipation around the heat dissipation device.

15. The method of claim 13, wherein rotating the die member about the central axis while translating the member away from the base along the central axis is performed with the rate of rotation and the rate of translation held generally constant to provide uniform inclination of the fins.

16. The method of claim 12, wherein forming the base comprises forming a substantially planar surface adapted to contact an electronic device.

* * * * *

UNITED STATES PATENT AND TRADEMARK OFFICE
CERTIFICATE OF CORRECTION

PATENT NO.     : 6,705,144 B2
DATED          : March 16, 2004
INVENTOR(S)    : Pollard, II et al.

It is certified that error appears in the above-identified patent and that said Letters Patent is hereby corrected as shown below:

<u>Column 7,</u>
Lines 3 and 38, delete "hear" and insert -- heat --, therefor.

<u>Column 8,</u>
Line 33, delete "hear" and insert -- heat --, therefor.

Signed and Sealed this

Third Day of August, 2004

JON W. DUDAS
*Acting Director of the United States Patent and Trademark Office*